United States Patent
Maeng

(10) Patent No.: US 6,987,070 B2
(45) Date of Patent: Jan. 17, 2006

(54) METHOD FOR FORMING LOW-K DIELECTRIC LAYER OF SEMICONDUCTOR DEVICE

(75) Inventor: Jong Sun Maeng, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/874,928

(22) Filed: Jun. 23, 2004

(65) Prior Publication Data

US 2005/0106862 A1 May 19, 2005

(30) Foreign Application Priority Data

Nov. 19, 2003 (KR) .................. 10-2003-0081973

(51) Int. Cl.
*H01L 21/31* (2006.01)
(52) U.S. Cl. .................. 438/778; 438/780; 438/781; 438/782; 438/778; 438/661; 438/665
(58) Field of Classification Search ............... 438/778, 438/447, 781, 780, 782, 661, 665
See application file for complete search history.

(56) References Cited

U.S. PATENT DOCUMENTS

| 6,790,792 B2 * | 9/2004 | Shaffer et al. ............... 438/790 |
| 2002/0068458 A1 * | 6/2002 | Chiang et al. ............... 438/694 |
| 2005/0064726 A1 * | 3/2005 | Reid et al. .................. 438/778 |
| 2005/0106862 A1 * | 5/2005 | Maeng ....................... 438/661 |

* cited by examiner

*Primary Examiner*—W. David Coleman
(74) *Attorney, Agent, or Firm*—Ladas & Parry LLP

(57) ABSTRACT

Disclosed is a method for forming a low-k dielectric layer of a semiconductor device. The method includes a step providing a semiconductor substrate having a predetermined pattern, a step coating porous powders having a micro size on the semiconductor by spraying the porous powders, and a step performing a heat treatment process with respect to a resultant structure, thereby forming the low-k dielectric layer. After micro-sized porous powders are coated on a semiconductor substrate, a heat treatment process is performed, so that powders are bonded to each other, thereby forming a low-k dielectric layer even if the dielectric layer has a dielectric constant equal to or less than 2.8. A signal delay time is reduced by depositing the low-k dielectric layer on the semiconductor substrate.

7 Claims, 2 Drawing Sheets heat treatment

METHOD FOR FORMING LOW-K DIELECTRIC LAYER OF SEMICONDUCTOR DEVICE

BACKGROUND OF THE INVENTION

1. Field of the Invention

The present invention relates to a method for manufacturing a semiconductor device, and more particularly to a method for forming a low-k (low dielectric constant) dielectric layer capable of reducing a signal delay time of a wiring by decreasing a dielectric constant of a dielectric layer used for manufacturing a semiconductor device such that the dielectric layer has a dielectric constant below 2.8.

2. Description of the Prior Art

In general, a silicon oxide layer is formed through a CVD (chemical vapor deposition) method or an SOG (spin on glass) method as an insulating layer for insulating a semiconductor device. When the silicon oxide layer is deposited, carbon and fluorine are added to the silicon oxide layer in order to decrease a dielectric constant of the silicon oxide layer.

However, when the dielectric constant of the silicon oxide layer is equal to or less than 2.8, there is a limitation to decrease the dielectric constant through the CVD method or the SOG method, so that a signal delay time of a wiring may increase.

SUMMARY OF THE INVENTION

Accordingly, the present invention has been made to solve the above-mentioned problems occurring in the prior art, and an object of the present invention is to provide a method for forming a low-k dielectric layer of a semiconductor device capable of forming a dielectric layer having a low dielectric constant equal to or less than 2.8 by coating micro-sized porous powder and performing a heat treatment process such that the dielectric layer has a plurality of pores.

In order to accomplish this object, there is provided a method for forming a low-k dielectric layer of a semiconductor device, the method comprising the steps of: providing a semiconductor substrate having a predetermined pattern; coating porous powders having a micro size on the semiconductor by spraying the porous powders; and performing a heat treatment process with respect to a resultant structure, thereby forming the low-k dielectric layer.

According to the preferred embodiment of the present invention, the coating process is performed under an inert gas atmosphere, and the semiconductor substrate is asymmetrically rotated in order to uniformly coat the powders on the substrate.

According to the preferred embodiment of the present invention, impurities are doped into porous powders having the micro size in order to activate the powders in a low temperature.

According to the preferred embodiment of the present invention, the coating process and the heat treatment process are performed in the same chamber.

According to the preferred embodiment of the present invention, a chemical mechanical polishing process is further carried out with respect to the low-k dielectric layer in order to adjust a thickness of the low-k dielectric layer, after the heat treatment step is performed.

According to the preferred embodiment of the present invention, the heat treatment step is carried out by using one of an RTP (rapid thermal process), a high-density plasma process, and a laser heat treatment process.

BRIEF DESCRIPTION OF THE DRAWINGS

The above object, features and advantages of the present invention will be more apparent from the following detailed description taken in conjunction with the accompanying drawings, in which:

FIG. 2 is a view showing micro-sized porous powder shown in FIG. 1a; and

DETAILED DESCRIPTION OF THE PREFERRED EMBODIMENTS

Figure 1A:
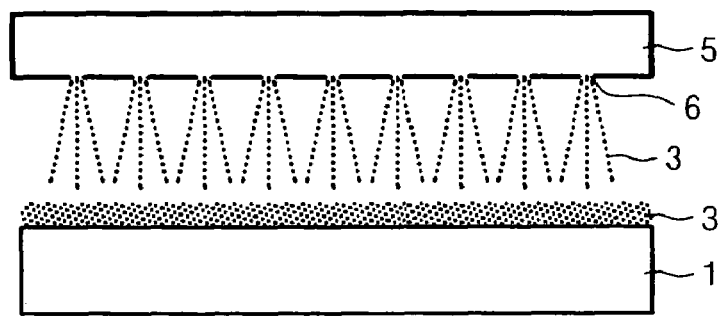
FIGS. 1a to 1c are views showing a method for forming a low-k dielectric layer of a semiconductor device according to one embodiment of the present invention.

Hereinafter, a preferred embodiment of the present invention will be described with reference to the accompanying drawings. In the following description and drawings, the same reference numerals are used to designate the same or similar components, and so repetition of the description on the same or similar components will be omitted.

Hereinafter, a method for forming a low-k dielectric layer of a semiconductor device according to one embodiment of the present invention will be explained with reference to FIGS. 1a to 3.

Figure 1B:
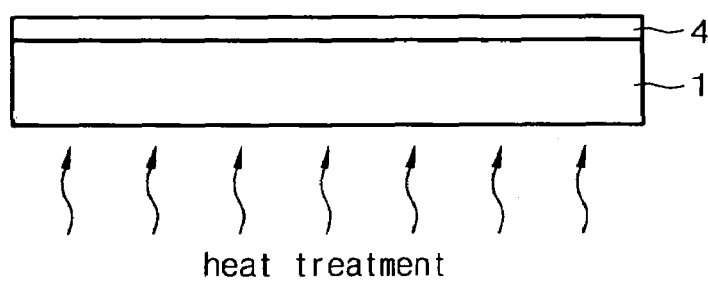

FIGS. 1a and 1b are views showing a method for forming a low-k dielectric layer of a semiconductor device according to one embodiment of the present invention.

As shown in FIG. 1a, according to the method for forming the low-k dielectric layer of the present invention, a semiconductor substrate 1 having a predetermined pattern is prepared first.

Then, after loading the semiconductor substrate 1 into a process chamber (not shown), micro-sized particles of porous powder 3 are coated on the semiconductor substrate 1 through a fine hole of a powder spray device 5 provided in the process chamber. At this time, the substrate 1 is asymmetrically rotated (that is, the center of rotation is not necessarily stationary in order to allow sprayed powders to be uniformly coated on a surface of the semiconductor substrate 1. In addition, when powders are coated on the semiconductor substrate 1, powders are prevented from reacting with other materials by maintaining an inert gas atmosphere through using gas including one selected from the group consisting of Ar, Ne, and N.

Meanwhile, impurities may be doped into micro-sized porous powders 3 such that micro-sized porous powders 3 can be easily reacted with materials at a low temperature.

Then, as shown in FIG. 1b, a heat treatment process is performed with respect to the semiconductor substrate coated with the powders in order to form a low-k dielectric layer 4. At this time, a powder coating process and the heat treatment process are carried out in one chamber in-situ, that is, the powder coating process and the heat treatment process are carried out in the same chamber. In addition, the heat treatment process includes an RTP (rapid thermal process) using RTP equipment providing a great thermal energy within a short period of time, a high-density plasma process using a high-density plasma source providing great thermal energy only onto a surface area of the semiconductor substrate, or a laser heat treatment process using a laser as a thermal source.

Figure 2:
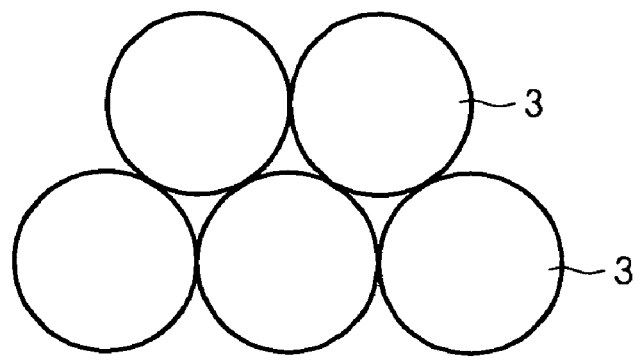

FIG. 2 is a view showing micro-sized porous powders shown in FIG. 1a.

Figure 3:
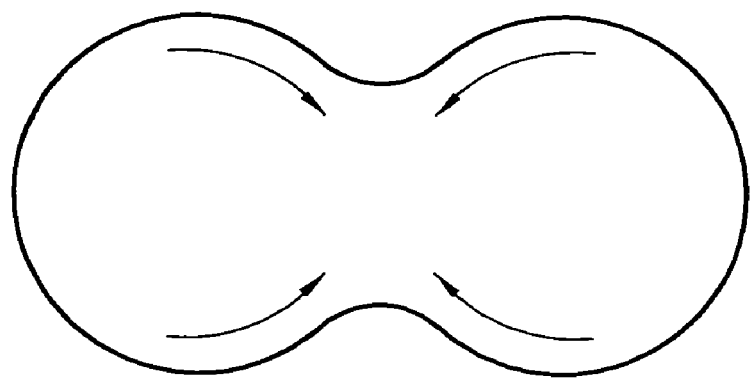
FIG. 3 is a view showing porous powders bonded to each other through a heat treatment process.

In addition, FIG. 3 is a view showing porous powders bonded to each other through a heat treatment process. Herein, an arrow shows a direction of a surface diffusion of powder atoms.

Meanwhile, since the powders have a micro size, a surface area thereof may relatively increase as compared with a volume thereof. Accordingly, the surface energy of the powders becomes high, so that the powders can react with and can be bonded to peripheral materials at a temperature significantly lower than a reaction temperature of a bulk. However, since the present invention performs the heat treatment, the surface diffusion is rapidly carried out so that powders can be bonded to each other while forming a predetermined pattern as shown in FIG. 3 even if a mechanical contact is simply applied to the powders as shown in FIG. 2. If the powders are bonded to each other through such a local bonding manner, the powders may have large-sized pores. Accordingly, micro-sized porous material, and the dielectric layer having the low dielectric constant can be deposited on the semiconductor substrate.

Figure 1C:
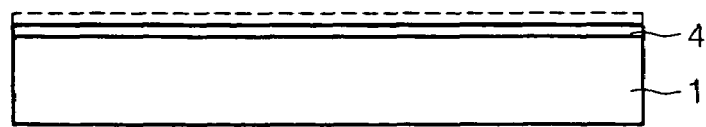

Then, as shown in FIG. 1c, a CMP (chemical mechanical polishing) process is carried out with respect to the low-k dielectric layer 4, so that a thickness of the low-k dielectric layer 4 can be adjusted to a desirable thickness. Parts shown with dotted lines in FIG. 1 represent the thickness of a low-k dielectric layer before performing a polishing process.

The low-k dielectric layer 4 according to the present invention has a plurality of pores, so the dielectric constant thereof can be decreased. In addition, the low-k dielectric layer 4 is made from porous material and acts as a protective layer for protecting the semiconductor substrate 1 from external environment and preventing a porous thin film from being damaged by the external environment.

Meanwhile, according to the present invention, distribution of powders can be variously formed in order to adjust density and porosity of the low-k dielectric layer after performing the heat treatment.

As described above, according to the present invention, after the micro-sized particles of the porous powder are coated on a semiconductor substrate, a heat treatment process is performed, so that the micro-sized particles are bonded to each other, thereby forming a low-k dielectric layer even if the dielectric layer has a dielectric constant equal to or less than 2.8. Accordingly, a signal delay time may be reduced by depositing a low-k dielectric layer according to the present invention on the semiconductor substrate.

In addition, according to the present invention, the dielectric layer can be polished through a CMP process so that a thickness of the low-k dielectric layer can be adjusted to a predetermined thickness.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for forming a low-k dielectric layer of a semiconductor device, the method comprising the steps of:
   i) providing a semiconductor substrate having a predetermined pattern;
   ii) coating micro-sized particles of porous powder on the semiconductor; and
   iii) performing a heat treatment process with respect to a resultant structure, wherein the micro-sized particles bond with each other to form the low-k dielectric layer of equal to or less than 2.8 dielectric constant and having a plurality of pores formed therein.

2. The method as claimed in claim 1, wherein step ii) is performed under an inert gas atmosphere.

3. The method as claimed in claim 1, wherein the dry porous powder is sprayed onto the while semiconductor substrate is rotating about a non-stationary rotating center when step ii) is performed.

4. The method as claimed in claim 1, wherein impurities are doped into porous powders having the micro size.

5. The method as claimed in claim 1, wherein steps ii) and iii) are performed in a same chamber.

6. The method as claimed in claim 1, further comprising a step of performing a chemical mechanical polishing process with respect to the low-k dielectric layer in order to adjust a thickness of the low-k dielectric layer, after the heat treatment step is performed.

7. The method as claimed in claim 1, wherein the heat treatment step is carried out by using one of an RTP (rapid thermal process), a high-density plasma process, and a laser heat treatment process.

* * * * *